United States Patent [19]

Toriakai et al.

[11] Patent Number: 5,134,204
[45] Date of Patent: Jul. 28, 1992

[54] RESIN COMPOSITION FOR SEALING SEMICONDUCTORS

[75] Inventors: Motoyuki Toriakai, Yokohama; Koutarou Asahina, Kanagawa; Mikio Kitahara, Yokohama; Koichi Machida, Yokohama; Takayuki Kubo, Yokohama, all of Japan

[73] Assignee: Mitsui Toatsu Chemicals, Inc., Tokyo, Japan

[21] Appl. No.: 516,718

[22] Filed: May 1, 1990

[30] Foreign Application Priority Data

May 12, 1989 [JP] Japan ................................. 1-117288

[51] Int. Cl.$^5$ ...................... C08F 283/00; C08G 8/28
[52] U.S. Cl. .................................. 525/481; 525/534; 528/96; 528/423; 528/98; 523/466
[58] Field of Search ................. 528/96, 423; 525/481, 525/534

[56] References Cited

U.S. PATENT DOCUMENTS

| | | |
|---|---|---|
| 4,277,600 | 7/1981 | Mark et al. ........................... 528/204 |
| 4,342,852 | 8/1982 | Takeda et al. ....................... 525/481 |
| 4,379,728 | 4/1983 | Lin ........................................ 528/98 |
| 4,382,128 | 5/1983 | Li .......................................... 524/513 |
| 4,579,916 | 4/1986 | Schmid et al. ....................... 528/98 |
| 4,888,407 | 12/1989 | Yasuhisa et al. .................... 528/96 |
| 4,913,697 | 4/1990 | Saito et al. ........................... 528/86 |
| 4,960,860 | 10/1990 | Saito et al. ........................... 528/96 |
| 4,980,436 | 12/1990 | Saito et al. ........................... 524/508 |

*Primary Examiner*—Paul R. Michl
*Assistant Examiner*—Christopher P. Rogers

*Attorney, Agent, or Firm*—Burns, Doane, Swecker & Mathis

[57] ABSTRACT

A resin composition for sealing semiconductors which shows high heat resistance and is suitable for sealing semiconductor devices, etc., and which comprises an organic component containing a polymaleimide compound represented by the general formula:

$$\left[ \begin{array}{c} HC-C \\ \parallel \\ HC-C \end{array} \begin{array}{c} O \\ \parallel \\ \diagdown \\ N-R_1 \\ \diagup \\ \parallel \\ O \end{array} \right]_m$$

where $R_1$ is a m-valent organic group having at least 2 carbon atoms and m is a positive integer of 2 or more, epoxy compounds mainly consisting of an epoxy compound represented by the general formula:

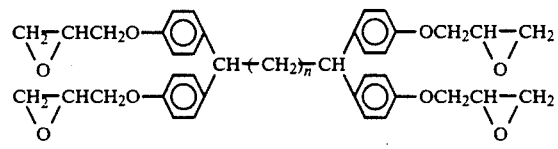

where n is a positive integer of 3–16 and a compound having two or more phenolic hydroxyl groups, and an inorganic filler.

10 Claims, No Drawings

RESIN COMPOSITION FOR SEALING SEMICONDUCTORS

BACKGROUND OF THE INVENTION

1. Field of the Invention

The present invention relates to a heat resistant resin composition for sealing semiconductors, and particularly to a resin composition suitable for sealing semiconductor devices in which high heat resistance is required, as in, for example, surface mounting semiconductor devices, semiconductors used at high temperatures, etc.

2. Description of the Prior Art

There is a trend to implement high density mounting in the fields of electric apparatuses, electronic parts, particularly semiconductors, and it has been necessary to develop a resin composition having high heat resistance to heat released during mounting or while being used.

Sealing with a resin has conventionally been carried out by transfer molding useing an epoxy resin from the standpoint of economy, and at present particularly a combined system of o-cresol novolac epoxy resin and a novolac phenol resin as a curing agent has predominantly been used because of high moisture resistance.

However, there is a tendency for the resin-sealing semiconductor device to shift to a surface mounting semiconductor device by following the trend of the above high density mounting. Different from the insertion semiconductor device, according to the surface mounting semiconductor, a package is exposed as a whole to a soldering temperature of 200° C. or higher. Additionally, the semiconductor devices are used at high temperatures for a long period of time as in around the automobile engine. Such a high heat resistance to the above high temperatures is demanded for the resin composition as the sealing material, and it has become impossible for the conventional epoxy resin to satisfy the above demand.

Therefore, attempts to increase the density of cross-linking have been made for the purpose of increasing the glass transition temperature. However, a simple increase in crosslink density causes such problems as an increase degree of water absorption of the resin and impairment of flexibility. An increase in degree of water absorption results in reduction in heat resistance and particularly in an increase of solder crack development at the time of moisture absorption, and a reduction in flexibility results in an increase of internal stress and in a reduction in thermal shock resistance.

SUMMARY OF THE INVENTION

An object of the present invention consists in providing a resin composition capable of imparting high heat resistnace without reducing water absorption properties and flexibility as a sealing material applicable to semiconductors, etc., in which high heat resistance is demanded.

The present inventors made intensive studies in order to achieve the above object and to a resin composition containing a special polymaleimide compound, an epoxy compound having a specified structure, a compound having two or more phenolic hydroxyl groups and an inorganic filler as the essential components, or of a resin composition containing epoxy resin in addition to the above components, and to accomplish this invention.

One aspect of the present invention provides a resin composition for sealing semiconductors, which contains a polymaleimide compound represented by the general formula (I), an epoxy compound represented by the general formula (II), a compound having two or more phenolic hydroxyl groups and an inorganic filler.

The present invention more particularly provides a resin composition, which contains an organic component containing (a) a polymaleimide compound represented by the general formula (I):

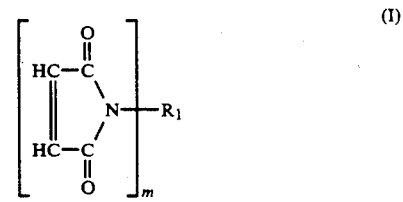

wherein $R_1$ is a m-valent organic group having at least 2 carbon atoms and m is an integer of 2 or more, (b) an epoxy compound represented by the general formula (II):

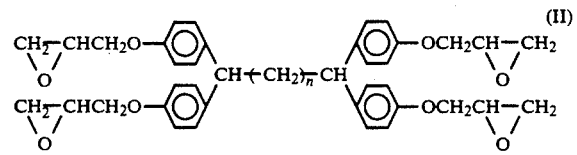

wherein n is an integer of 3 to 16, or epoxy compounds consisting essentially of the epoxy compound and (c) a compound having two or more phenolic hydroxyl groups, and contains (d) an inorganic filler.

Since the resin composition for sealing semiconductors of the present invention has good water absorption properties and flexibility and can impart heat resistance, the use of the resin composition for sealing the semiconductor devices, in which high heat resistance is demanded, makes it possible to provide high reliability.

DESCRIPTION OF THE PREFERRED EMBODIMENTS

The component (a) used in the resin composition of the present invention is a polymaleimide compound represented by the general formula (I), and is a compound having two or more maleimide groups.

Examples of the polymaleimide compound include N,N'-ethylenebismaleimide, N,N'-hexamethylenebismaleimide, N,N'-(1,3-phenylene)bismaleimide, N,N'-(1,4-phenylene)bismaleimide, bis(4-maleimidophenyl)methane, bis(4-maleimidophenyl)ether, bis(3-chloro-4-maleimidophenyl)methane, bis(4-maleimidophenyl)sulfone, bis(4-maleimidocyclophenyl)-methane, 1,4-bis(maleimidomethyl)-cyclohexane, 1,4-bis(4-maleimidophenyl)-cyclohexane, 1,4-bis(maleimidomethyl)-benzene, poly(maleimidophenylmethylene), and the like. In the above polymaleimide compounds, the following two kinds of polymaleimide compounds are preferred in order to effectively achieve the object of the present invention.

The first is a bismaleimide compound represented by the general formula (III):

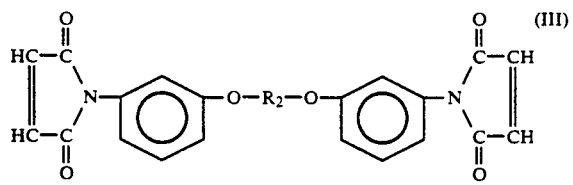

wherein $R_2$ is a bivalent group consisting of

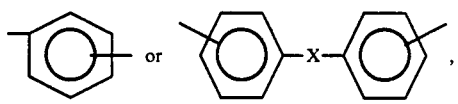

and X is, directly bonded, a bivalent hydrocarbon group having 1–10 carbon atoms, or is a bivalent group consisting of hexafluoroisopropylidene, carbonyl, thio, sulfinyl, sulfonyl or oxy.

The above bismaleimide compound may easily be prepared by a condensation dehydration reaction of a diamine represented by the general formula (IV):

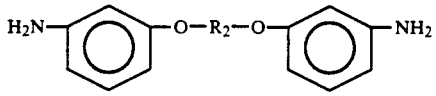

where $R_2$ is as defined in the general formula (III) with maleic anhydride according to a conventional process.

Specific examples of the bismaleimide compound may include 1,3-bis(3-maleimidophenoxy)benzene, bis [4-(3-maleimidophenoxy)phenyl] methane, 1,1-bis [4-(3-maleimidophenoxy)phenyl] ethane, 1,2-bis [4-(3-maleimidophenoxy)phenyl] ethane, 2,2-bis [4-(3-maleimidophenoxy)phenyl] propane, 2,2-bis [4-(3-maleimidophenoxy)phenyl] butane, 2,2-bis [4-(3-maleimidophenoxy)phenyl] -1,1,1,3,3,3-hexafluoropropane, 4,4'-bis(3-maleimidophenoxy)biphenyl, bis [4-(3-maleimidophenoxy)phenyl] ketone, bis [4-(3-maleimidophenoxy)phenyl] sulfide, bis [4-(3-maleimidophenoxy)phenyl] sulfoxide, bis [4-(3-maleimidophenoxy)phenyl] sulfone, bis [4-(3-maleimidophenoxy)phenyl] ether, and the like.

The second preferred compound is a polymaleimide compound represented by the general formula (V):

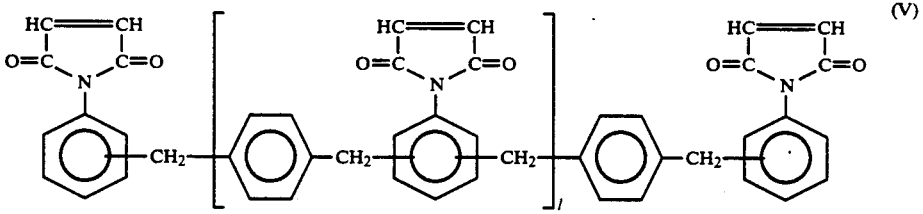

wherein $l$ is 0 to 10 on the average.

The above polymaleimide compound may easily be prepared by the condensation.dehydration reaction of a polyamine represented by the general formula (VI):

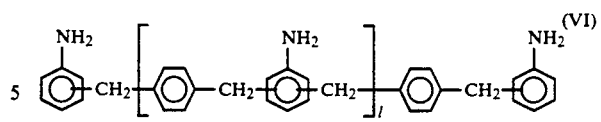

wherein $l$ is 0 to 10 on the average, with maleic anhydride according to a conventional process.

The above polymaleimide compounds may be used alone or in combination.

The compound (b) used in the resin composition of the present invention is an epoxy compound mainly consisting of the epoxy compound represented by the general formua (II), and includes the epoxy compound represented by the general formula (II) and mixtures thereof with other epoxy compounds.

The epoxy compound represented by the general formula (II) may be prepared by reacting epichlorohydrin with a phenol compound prepared by reacting a dialdehyde compound represented by the general formula (VII):

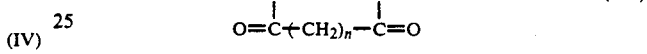

wherein n is a positive integer of 3 to 16 with phenol in the presence of an acid catalyst, represented by the general formula (VIII):

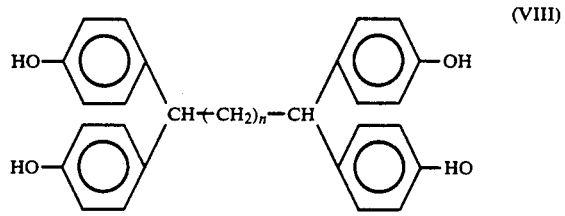

where n is a positive integer of 3–16.

The phenol compound represented by the general formula (VIII) and used for the preparation of the epoxy compound represented by the general formula (II) may include where n is 3–16, preferably 5–12 in the general formula (VIII).

When n is less than 3, flexibility is impaired, and when n is more than 17, high heat resistance can not be obtained.

Specific examples of the phenol compound may include 1,1,7,7-tetrakis-(hydroxyphenyl)heptane, 1,1,8,8-tetrakis-(hydroxyphenyl)octane, 1,1,9,9-tetrakis-hydroxyphenyl)nonane, 1,1,10,10-tetrakis-(hydroxyphenyl)decane, 1,1,11,11-tetrakis-(hydroxyphenyl)undecane, 1,1,12,12-tetrakis-(hydroxyphenyl)dodecane, 1,1,13,13-tetrakis-(hydroxyphenyl)tridecane, 1,1,14,14-tetrakis-(hydroxyphenyl)tetradecane, and the like.

As the multivalent epoxy compound used in combination with the epoxy compound represented by the general formula (II) as the essential component, a novolac epoxy resin derived from a novolac resin, which is a reaction product between phenols such as phenol, cresol, resorcinol and the like, and aldehydes, is preferred from the standpoint of heat resistance and electrical properties.

The above epoxy resin may further include a glycidyl epoxy resin prepared by reacting epichlorohydrin or 2-methylepichlorohydrin with a compound having two or more active hydrogen atoms in one melecule, i.e. ① a poly(hydroxyphenyl) compound such as bisphenol A, bishydroxydiphenylmethane, resorcinol, bishydroxyphenyl ether, tetrabromobisphenol A or the like; ② a polyhydric alcohol compound such as ethylene glycol, neopentyl glycol, glycerin, trimethylol propane, pentaerythritol, diethylene glycol, polypropylene glycol, bisphenol A-ethylene oxide adduct, trishydroxyethyl isocyanurate or the like; ③ a amino compund such as ethylenediamine, aniline, 4,4'-diaminodiphenyl methane or the like ; or ④ a multivalent carboxy compound such as adipic acid, phthalic acid, isophthalic acid or the like; an aliphatic or alicyclic epoxy compound such as dicyclopentadiene diepoxide, butadiene dimer diepoxide or the like.

Further, the above epoxy resin may be modified by use of an oily or rubbery silicone compound (see, for example, silicone modified epoxy resin, etc. prepared by the processes disclosed in Japanese Patent Application Laid-Open Nos. 270617/87 and 273222/87).

The above epoxy compounds may be used alone or in combination to be combined with the epoxy compound represented by the general formula (II).

The above epoxy compounds further included in the composition may preferably be used in amount of 50% or less by weight per the component (c).

A compound having two or more phenolic hydroxyl groups in one molecule may be widely used as component (c) of the composition in the present invention.

The above phenol compounds include, for example, ① a novolac phenol resin represented by the general formula (IX):

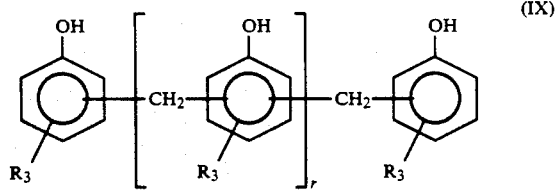

where R₃ is hydrogen atom, hydroxyl group or alkyl group having 1-9 carbon atoms, and r is an integer of one or more, which prepared by reacting phenols such as phenol, xylenol, resorcinol and the like with aldehydes; ② an aralkyl phenol represented by the general formulas (X) or (XI):

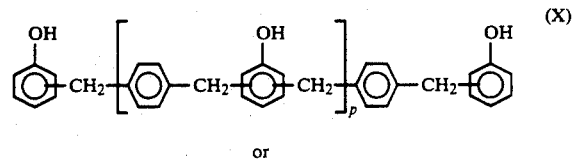

or

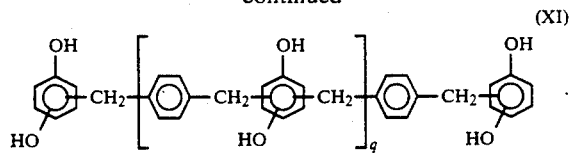

where p and q are an integer of 0 to 10 respectively; or ③ compounds such as tri(hydroxyphenyl)methane, tetra(hydroxyphenyl)ethane and the like, or an phenol compound represented by the general formula (VIII) which obtained as a intermediate in the preparation of the epoxy resin represented by formula (I), and the like.

The above phenols may be used in single or in combination with 2 or more.

The inorganic filler used as the component (d) of the resin composition in the present invention includes inorganic powder or fiber, for example, powders of crystalline silica, fused silica, alumina, silicon nitride, silicon carbide, titanium white and the like and fibers such as glass fiber, carbon fiber and the like. Of these, powders of crystalline silica and melt silica are preferred from the standpoints of coefficient of thermal expansion, thermal conductdivity, etc., and further a spherical silica powder is preferred from the standpoint of flowability at the time of molding. So long as the flowability is not impaired, a crushed silica powder may also be incorporated and used.

In order to uniformly disperse the above inorganic filler in the composition of the above components, a coupling agent may preferably be added. Examples of the coupling agent include silane, titanate, zircoaluminate and the like. The coupling agent may be added when all if the starting materials are mixed to prepare the resin compesition, but preferably may be mixed with the inorganic filler beforehand to be adhered onto the surface of the inorganic filler or to be reacted therewith.

In order to effectively achieve the object of the present invention, a total amount of the epoxy compound as component (b) and the phenol compound as component (c) is in the range of 10–500 parts by weight, preferably 25–300 parts by weight per 100 parts by weight of the polymaleimide compound as component (a), and the ratio of the amount of component (b) to that of component (c) may be such that the ratio of phenolic hydroxyl groups of component (c) to epoxy groups of component (b) is in the range of 0.1–10, preferably 0.5–2.0.

The filler component as (d) component may preferably be used in an amount of 100 to 800 parts by weight per 100 parts by weight of the sum of component (a),- component (b) and component (c). When the above amount is less than 100 parts by weight, thermal coefficient of expansion is too high to obtain high thermal shock resistance. When the above amount is more than 800 parts by weight, flowability of the resin is reduced and molding properties are impaired.

The resin composition of the present invention may preferably be cured by use of a curing promoter. Examples of the curing promoter include imidazoles such as 2-methylimidazole, 2-methyl-4-ethylimidazole and the like, amines such as triethanol amine, triethylene diamine, tris(polyoxyalkyl)amine, N-methylmorpholine and the like, organic phosphines such as tributyl phosphine, triphenyl phosphine, tritolyl phosphine and the like, tetraphenyl borates such as tetraphenylphosphonium tetraphenyl borate, triethylammonium tetraphenyl borate and the like, 1,8-diazabicyclo(5,4,0)undecene-7 and derivatives thereof, and the like.

The curing promoters may be used alone or in combination, or may be used, when needed, along with organic peroxides and azo compounds.

The curing promoter may be used in an amount of 0.01 to 10% by weight based on a total amount of the component (a), component (b) and component (c).

The resin composition of the present invention may be formulated, in addition to the above components when needed, from a reaction diluent generally used for imide resins, for example, diallylphthalate, triallylisocyanurate, o,o'-diallylbisphenol A, etc., a release agent such as various silicone oils, fatty acid, fatty acid salt, wax or the like, a flame-retardant such as a bromine compound, antimony, phosphorus or the like, a coloring agent such as carbon black, and the like, and may be mixed and kneaded to form a molding material.

The present invention will be explained more in detail by the following. Examples, in which the performance test methods for the composition are as follows.

Glass Transition Temperature and Thermal Coefficient of Expansion: TMA Method

Flexural Strength and Flexural Modulus: JIS K-6911
Degree of Water Absorption:

The same test piece as in the flexural test is left standing for 24 hours in a pressure cooker tester under 2 atms at 121° C., followed by measuring an increase in weight.

Heat Deterioration Test at 200° C.:

The same test piece as in the flexural test is left standing for 1000 hours in a constant temperature bath at 200° C., followed by measuring flexural strength.

Aluminum Circuit Slide:

The same semiconductor device as that used in the tests is subjected to 1000 tests alternately repeating a cycle of cooling and heating under the conditions of $-65°$ C. (30 minutes)-150° C. (30 minutes), followed by measuring slippage of a bonding pad on the test device.

VPS Test:

The same semiconductor device as that used in the test is left standing for 24 hours in a pressure cooker tester under 2 atms at 121° C., immediately followed by introducing into FLUORINERT(FC-70, trademark, by Sumitomo Three M) at 215° C., and by counting the number of semiconductor devices having cracks developed in the package resin (The numerator represents the number of semiconductor devices having cracks developed, and the denominator represents the total number of semiconductor devices subjected to the test).

High Temperature Storage Test:

The semiconductor device is left standing for 1000 hours in a constant temperature bath at 200° C., followed by subjecting to a current application test to be represented by an accumulative failure rate of semiconductor devices in which no current flows.

SYNTHESIS EXAMPLE 1

Synthesis of polymaleimide (1)

A reaction flask equipped with a stirrer and a thermometer is charged with 43.2 g (0.44 mole) of maleic anhydride and 130 g of (acetone to dissolve the maleic anhydride), followed by adding at room temperature a solution obtained by dissolving 73.6 g (0.2 mole) of 4,4'-bis(3-aminophenoxy)biphenyl in 515 g of acetone, and by stirring 3 hours at 23°-27° C. After the completion of the reaction, the crystals thus formed are filtered and washed with acetone, followed by drying to obtain bismaleamide acid as yellow crystals. Into 300 g of acetone is dispersed 112 g of bismaleamide acid thus obtained, followed by adding 9.6 g of triethylamine, and by stirring for 30 minutes at room temperature.

Thereafter, 0.4 g magnesium oxide (II) and 0.04 g of cobalt acetate (II).4H$_2$O are added, followed by adding 52.0 g of acetic anhydride at 25° C. over 30 minutes, and by stirring for 3 hours. After the completion of the reaction, the crystals thus formed are filtered, washed and dried to obtain polymaleimide compound (I) as light yellow crystals.

Amounts obtained: 84.5 g (Yield: 80.0%);
mp: 207°-209° C.

| | Elemental Analysis (%): | | |
|---|---|---|---|
| | C | H | N |
| Calculated | 72.72 | 3.81 | 5.30 |
| Measured | 72.54 | 3.59 | 5.31 |

SYNTHESIS EXAMPLE 2

Synthesis of polymaleimide compound (2)

A reactor equipped with a stirrer and a thermometer is charged with 111.6 g (1.2 moles) of aniline and 70.0 g (0.4 mole) of α, α'-dichloro-p-xylene which are heated while passing nitrogen gas therethrough. When the inner temperature reaches about 30° C., heat evolution is observed, and heating is continued to maintain the temperature at 85°-100° C. for 3 hours (a first stage reaction). Thereafter, heating is continued to react at 190°-200° C. for 20 hours (a second stage reaction). The above reaction is followed by cooling so that the inner temperature may be 95° C., adding 230 g of 15% aqueous caustic soda solution, and by neutralizing with agitation. After settling, the lower aqueous layer is separated and removed, and 300 g of a saturated saline solultion is added for washing and is then separated. Next, heating and dehydration are carried out under a stream of nitrogen gas, followed by filtering under pressure to remove inorganic salts, etc., and by subjecting to vacuum concentration under a vacuum of 2-3 mm Hg to recover 48.5 g of unreacted aniline. The residue is removed to obtain 100 g of aniline resin showing a light yellowish brown color.

A reaction flask equipped with a stirrer and a thermometer is charged with 35.8 g (0.358 mole) of maleic anhydride and 40 g of acetone (to dissolve the maleic anhydride). Adding of a solution prepared by dissolving 50 g of the above aniline (amine value: 0.65 equivalent/100 g) in 50 g of acetone results in the deposition of crystals, and strring is carried out at 25° C. for 3 hours. Thereafter, 8.5 g of triethylamine is added, followed by stirring at 25° C. for 30 minutes. After adding 0.35 g of magnesium oxide (III) and 0.035 g of cobalt acetate.4-H$_2$O, 45.5 g of acetic anhydride is charged, followed by stirring at 50°-55° C. for 3 hours, cooling down to 25° C., adding the resulting reaction solution into 1 l of water with agitation, and filtering, washing and drying the crystals thus obtained to obtain polymaleimide compound (2) as brown crystals. The above polymaleimide compound (2) is subjected to compositional analysis by means of high speed liquid chromatography, resulting in a compound containing 25% of l=0, 23% of l=1, 17% of l=2 and 35% of l≧3 in the general formula (IV) respectively. Amounts obtained: 74.2 g (yield: 98.1%), mp: 115°-130° C.

SYNTHESIS EXAMPLE 3

Synthesis of epoxy compound (1)

A reactor equipped with a thermometer, a condenser, a dropping funnel and a stirrer is charged with 1.0 mole of phenol and 0.1 mole of dodecane diol is heated up to 40° C., followed by adding 0.2 ml of concentrated hydrochloric acid, maintaining the temperature at 50° C. for 30 minutes so that heat evolution stops, and by heating up to 90° C. so that reaction occure for 5 hours. Next, volatile matters are removed under 5 mm Hg at 150° C. to obtain, a phenol compound (1) having a softening point of 69.2° C. and a hydroxyl aquivalent of 136 and containig 0.5% of free phenol.

A reactor equipped with a thermometer, a separating tube, a dropping funnel and a stirrer is charged with one mole of the phenol compound thus obtained to be dissolved in 10 moles of epichlorohydrin, followed by heating at 60° C., and by continuously addition of 400 g of a 40% aqueous sodium hydroxide solution over 2 hours, during which epichlorohydrin and water are subjected to azeotropic distillation, followed by liquifying, separating by the separating tube to an organic layer and an aqueous layer, and by removing the aqueous layer out of the system and recirculating the organic layer within the system. After the completion of the reaction, unreacted epichlorohydrin is removed under a vacuum of 5 mm Hg at 150° C. and the reaction product is dissolved in methyl isobutyl ketone. Next, a salt by-product is filtered off, followed by evaporating and removing methyl isobutyl ketone to obtain an epoxy compound (1) having a softening point of 50° C. and an epoxy equivalent of 191.

SYNTHESIS EXAMPLE 4

In the same manner as in Synthesis Example 3 except that octane diol is used in place of dodecane diol, a phenol compound (2) having a softening point of 98.9° C. and a hydroxyl equivalent of 122 and containing 0.5% of free phenol is obtained.

By use of phenol compound (2), epoxy compound (2) is prepared in the same manner as in Synthesis Example 1. Epoxy compound (2) has a softening point of 749° C. and an epoxy equivalent of 178.

EXAMPLES 1-8 AND COMPARATIVE EXAMPLES 1-2

Formulations having compositions (parts by weight) shown in Table-1 are melted and mixed by a heated roller at 100°-130° C. for 3 minutes, followed by cooling and crushing, and by tableting to obtain resin compositions for molding.

Of the starting materials shown in Table 1, ones other than compounds from Synthesis Examples are as follows.

Epoxy resin: EOCN-1027, trademark, by Nihon Kayaku Co., Ltd.

Bis(maleimidophenyl)methane: BMI-S, trademark, by Mitsui Toatsu Chemicals, Inc.

Novolac phenol resin: PN-80, trademark, by Nihon Kayaku Co., Ltd.

Spherical fused silica: S-CO, trademark, by MICRON CO., Ltd.

Test pieces for the measurements of physical properties are prepared according to a transfer molding process (180° C., 30 kg/cm$^2$, 3 minutes) with the above compositions. A part carrying an element of the lead frame for use in a flat package is loaded with a 10 mm×10 mm square element for testing and equipped with aluminum bonding pads of 100 μ×100μ and 10μ in thickness in four corners and with aluminum circuits having a width of 10μ and connecting the above pads, and the lead frame is connected with the bonding pads by gold wire, followed by subjecting to transfer molding under the same conditions as above to obtain a semiconductor device for testing.

These molded products for testing are post cured at 180° C. for 6 hours prior to carrying out respective tests. Test results are shown in Table 2.

TABLE 1

| | Examples | | | | | | | | Comparative Example | |
|---|---|---|---|---|---|---|---|---|---|---|
| | 1 | 2 | 3 | 4 | 5 | 6 | 7 | 8 | 1 | 2 |
| Epoxy resin | | | | | | | 2.0 | 2.0 | 6.4 | 16.0 |
| Epoxy compound (1) | 6.2 | 6.2 | | | 6.2 | 6.2 | 4.2 | | | |
| Epoxy compound (2) | | | 6.4 | 6.4 | | | | 4.4 | | |
| Bis(4-maleimidophenyl)methane | | | | | | 15.0 | | | 15.0 | |
| Polymaleimide compound (1) | 15.0 | 15.0 | 15.0 | 15.0 | | | 15.0 | 15.0 | | |
| Polymaleimide compound (2) | | | | | 15.0 | | | | | |
| Novolac phenol resin | 3.8 | | 3.6 | | 3.8 | 3.8 | 3.8 | 3.6 | 3.6 | 9.0 |
| Aralkyl phenol resin | | 3.6 | | 3.6 | | | | | | |
| Spherical fused silica (mean particle size: 20μ) | 75 | 75 | 75 | 75 | 75 | 75 | 75 | 75 | 75 | 75 |
| Triphenyl phosphine | 0.1 | 0.1 | 0.1 | 0.1 | 0.1 | 0.1 | 0.1 | 0.1 | 0.1 | 0.1 |
| Triethylammonium tetraphenyl borate | 0.3 | 0.3 | 0.3 | 0.3 | 0.3 | 0.3 | 0.3 | 0.3 | 0.3 | 0.3 |
| Silane coupling agent | 0.6 | 0.6 | 0.6 | 0.6 | 0.6 | 0.6 | 0.6 | 0.6 | 0.6 | 0.6 |
| Carnauba wax | 0.45 | 0.45 | 0.45 | 0.45 | 0.45 | 0.45 | 0.45 | 0.45 | 0.45 | 0.45 |
| Carbon black | 0.3 | 0.3 | 0.3 | 0.3 | 0.3 | 0.3 | 0.3 | 0.3 | 0.3 | 0.3 |
| Antimony oxide | 1.0 | 1.0 | 1.0 | 1.0 | 1.0 | 1.0 | 1.0 | 1.0 | 1.0 | 1.0 |

TABLE 2

| | Examples | | | | | | | | Comparative Example | |
|---|---|---|---|---|---|---|---|---|---|---|
| | 1 | 2 | 3 | 4 | 5 | 6 | 7 | 8 | 1 | 2 |
| Glass transition temperature (°C.) | 205 | 200 | 219 | 210 | 205 | 205 | 200 | 210 | 200 | 160 |
| Coefficient of thermal expansion (× $10^{-5}$) | 1.4 | 1.4 | 1.4 | 1.4 | 1.4 | 1.4 | 1.4 | 1.4 | 1.6 | 1.7 |

TABLE 2-continued

| | Examples | | | | | | | | Comparative Example | |
|---|---|---|---|---|---|---|---|---|---|---|
| | 1 | 2 | 3 | 4 | 5 | 6 | 7 | 8 | 1 | 2 |
| Flexural strength (kg/mm²) | | | | | | | | | | |
| room temperature | 16.0 | 16.0 | 16.5 | 16.5 | 16.0 | 16.0 | 16.0 | 16.5 | 16.0 | 15.0 |
| 215° C. | 6.5 | 5.5 | 7.0 | 6.5 | 6.5 | 6.3 | 6.0 | 6.5 | 5.0 | 1.0 |
| Flexural modulus (kg/mm²) | 1500 | 1470 | 1550 | 1500 | 1500 | 1550 | 1550 | 1580 | 1600 | 1500 |
| Degree of water absorption (121° C., 2 atms, 24 hours, %) | 0.35 | 0.33 | 0.35 | 0.33 | 0.35 | 0.60 | 0.35 | 0.35 | 0.83 | 0.35 |
| Heat deterioration at 200° C. Strength retention after 1000 hours (%) | 95 | 93 | 95 | 93 | 95 | 95 | 95 | 95 | 90 | 50 |
| Aluminum circuit slide (μ) | 0 | 0 | 0 | 0 | 0 | 2 | 0 | 0 | 5 | 25 |
| VPS test | 0/20 | 0/20 | 0/20 | 0/20 | 0/20 | 5/20 | 0/20 | 0/20 | 15/20 | 20/20 |
| High temperature storage test (accumulative failure rate: %) | 0 | 0 | 0 | 0 | 0 | 0 | 0 | 0 | 0 | 63 |

What is claimed is:

1. A resin composition for sealing semiconductors comprising an organic component containing (a) a polymaleimide compound represented by the general formula (I):

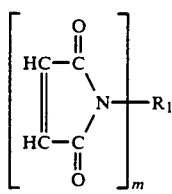 (I)

wherein $R_1$ is a m-valent organic group having at least two carbon atoms and m is a positive integer of two or more, (b) an epoxy represented by the general formula (II):

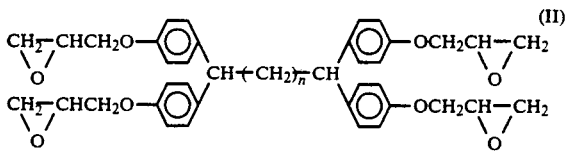 (II)

wherein n is a positive integer of 3-16, or epoxy compounds consisting essentially of the epoxy compound and (c) a compound having two or more phenolic hydroxyl groups, and (d) an inorganic filler.

2. A resin composition for sealing semiconductors as claimed in claim 1, wherein the polymaleimide compound (a) is a bismaleimide compound represented by the general formula (III):

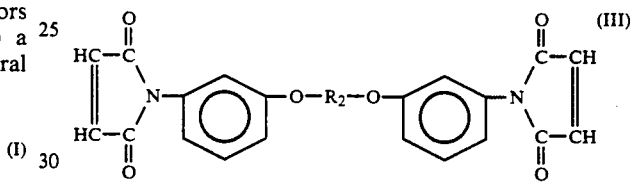 (III)

wherein $R_2$ is a bivalent group comprising

and X is, directly bonded, a bivalent hydrocarbon group having 1-10 carbon atoms, or is a bivalent group consisting of hexafluoroisopropylidene, carbonyl, thio, sulfinyl, sulfonyl or oxy.

3. A resin composition for sealing semiconductors as claimed in claim 1, wherein the polymaleimide compound (a) is a bismaleimide compound represented by the general formula (V):

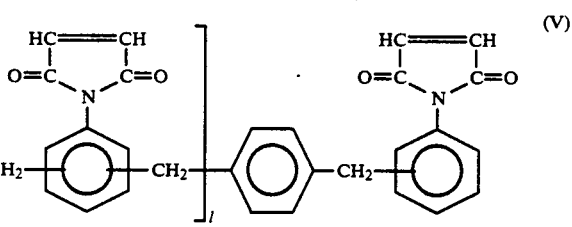 (V)

wherein l is 0–10 on the average.

4. A resin composition for sealing semiconductors as claimed in claim 1 wherein the epoxy compound further includes novolac epoxy resin, glycidyl epoxy resin, and aliphatic or alicyclic epoxy compound.

5. A resin composition for sealing semiconductors as claimed in claim 1, wherein the compound having two or more phenolic hydroxyl groups as component (c) is novolac phenol resin represented by the general formula (IX):

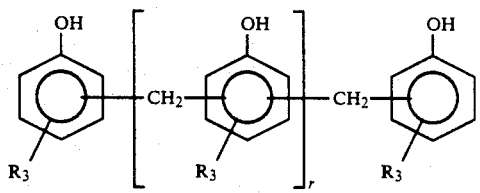

(IX)

wherein $R_3$ is hydrogen atom, hydroxyl group or alkyl group having 1-9 carbon atoms and r is an integer of one or more.

6. A resin composition for sealing semiconductors as claimed in claim 1, wherein the compound having two or more phenolic hydroxy groups as component (c) is aralkyl phenol resin represented by the general formula (X) or (XI):

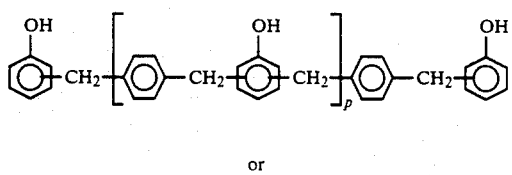

(X)

or

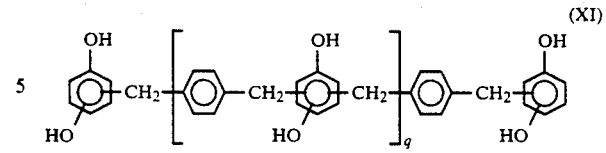

(XI)

where p and q are an integer of 0-10.

7. A resin composition for sealing semiconductors as claimed in claim 1, wherein the compound having two or more phenolic hydroxyl groups as component (c) is selected from novolac phenol resin, aralkyl phenol resin, tri(hydroxyphenyl)methane and tetra(hydroxyphenyl)ethane.

8. A resin composition for sealing semiconductors as claimed in claim 1, wherein a total amount of components (b) and (c) is in the range of 10 to 500 parts by weight per 100 parts by weight of the polymaleimide compound as component (a).

9. A resin composition for sealing semiconductors as claimed in claim 1, wherein a ratio of an amount of component (b) to that of component (c) is such that the ratio of epoxy groups in component (b) to phenolic hydroxyl groups in component (c) is in the range of 0.1 to 10.

10. A resin composition for sealing semiconductorts as claimed in claim 1, wherein the inorganic filler as filler component (d) is used in an amount of 100 to 800 parts by weight per 100 parts by weight of the resin components.

* * * * *